(12) United States Patent
Eggers

(10) Patent No.: US 11,226,385 B2
(45) Date of Patent: Jan. 18, 2022

(54) DIXON TYPE WATER/FAT SEPARATION MR IMAGING WITH IMPROVED FAT SHIFT CORRECTION

(71) Applicant: KONINKLIJKE PHILIPS N.V., Eindhoven (NL)

(72) Inventor: Holger Eggers, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/651,398

(22) PCT Filed: Sep. 26, 2018

(86) PCT No.: PCT/EP2018/076035
§ 371 (c)(1),
(2) Date: Mar. 27, 2020

(87) PCT Pub. No.: WO2019/063574
PCT Pub. Date: Apr. 4, 2019

(65) Prior Publication Data
US 2020/0300948 A1  Sep. 24, 2020

(30) Foreign Application Priority Data

Sep. 28, 2017  (EP) .................................. 17193731

(51) Int. Cl.
*G01R 33/48* (2006.01)
*G01R 33/565* (2006.01)
*G01R 33/56* (2006.01)

(52) U.S. Cl.
CPC ..... *G01R 33/4828* (2013.01); *G01R 33/5602* (2013.01); *G01R 33/56545* (2013.01); *G01R 33/56563* (2013.01)

(58) Field of Classification Search
CPC ............ G01R 33/4828; G01R 33/5602; G01R 33/56545; G01R 33/56563;
(Continued)

(56) References Cited

U.S. PATENT DOCUMENTS

| 2010/0244822 A1 | 9/2010 | Yu et al. |
| 2011/0091090 A1 | 4/2011 | Dahlqvist et al. |

(Continued)

OTHER PUBLICATIONS

Lu W, et al. Water-fat separation with bipolar multi-echo sequences. Magn Reson Med 2008; 60: 198-209.
(Continued)

*Primary Examiner* — Rishi R Patel

(57) ABSTRACT

The invention relates to a method of Dixon-type MR imaging. It is an object of the invention to provide an MR imaging technique using bipolar readout magnetic field gradients with an improved estimation of the main field inhomogeneity to eliminate residual artifacts. In accordance with the invention, a method of MR imaging of an object placed in a main magnetic field within an examination volume of a MR device is proposed, wherein the method comprises the steps of: —subjecting the object (10) to an imaging sequence to generate at least two sets of echo signals at two or more different echo times using bipolar pairs of readout magnetic field gradients, one set of echo signals being generated at a first echo time (TE1) and the other set of echo signals being generated at a second echo time (TE2), —acquiring the echo signals from the object (10), —reconstructing a first image from the echo signals attributed to the first echo time (TE1) and a second image from the echo signals attributed to the second echo time (TE2), —computing modified first and second images by compensating for a fat shift in the reconstructed first and second images respectively, —estimating phase errors in the acquired echo signals on the basis of the first and second
(Continued)

images and the modified first and second images using a signal model including the resonance spectra of fat and water and the spatial variation of the main magnetic field, and —reconstructing a water image and/or a fat image by separating the signal contributions of fat and water to the acquired echo signals using the estimated phase errors. Moreover, the invention relates to a MR device (1) and to a computer program to be run on a MR device (1).

8 Claims, 2 Drawing Sheets

(58) Field of Classification Search
CPC ........ G01R 33/56572; G01R 33/56554; G01R 33/5659; G01R 33/485; G01R 33/5616; G01R 33/56527
See application file for complete search history.

(56) References Cited

U.S. PATENT DOCUMENTS

| | | |
|---|---|---|
| 2012/0301007 A1 | 11/2012 | Shirai et al. |
| 2016/0187447 A1 | 6/2016 | Hwang et al. |
| 2016/0231405 A1* | 8/2016 | Eggers ............. G01R 33/56518 |
| 2016/0313423 A1 | 10/2016 | Eggers |
| 2017/0038446 A1 | 2/2017 | Liu et al. |
| 2018/0259607 A1* | 9/2018 | Liu ...................... G01R 33/243 |

OTHER PUBLICATIONS

Eggers H, et al. Chemical shift encoding-based water-fat separation methods. J Magn Reson Im-aging 2014; 40:251-268.
Eggers H, et al. Dual-echo Dixon imaging with flexible choice of echo times. Magn Reson Med 2011; 65:96-107.
Junmin Liu et al., "Method of B0 Mapping with Magnitude-Based Correction for Bipolar Two-Point Dixon Cardiac MRI" Magnetic Resonance in Med. (2016).
Tobias Romu et al., "Robust Water Fat Separated Dual-Echo MRI by Phase-Sensitive Reconstruction" Magnetic Resonance in Med. (2016).
Huanzhou Yu et al.Phase and Amplitude Correction for Multi-Echo Water-Fat Separation With Bipolar Acquisitions J Magn Reson Imaging. May 2010 ; 31(5): 1264-1271. doi:10.01002/jmri.22111.
Huanzhou Yu et al.. Combination of Complex-Based and Magnitude-Based Multiecho Water-Fat Separation for Accurate Quantification of Fat-Fraction; Magnetic Resonance in Med. 66 p. 199-206 (2011).
Jingfei Ma et al. "Linear Phase-Error Correction for Improved Water and Fat Separation in Dual-Echo Dixon Techniques" Magnetic Resonance in Med. 60 p. 1250-1255 (2008).
Doneva et al. "Compressed Sensing for Chemical Shift Based Water Fat Separation" Magnetic Resonance in Med. 24 p. 1749-1759 (2010).
Sharma et al. "Improving Chemical Shift Encoded Water-Fat Separation using Object Based Information of the Magnetic Field Inhomogeneity" Magnetic Resonance in Med. vol. 73, No. 2 p. 597-604 (2014).
Ben et al. "Correction of Fat-Water Swaps in Dixon MRI" Network and Parallel Computing, p. 536-543 (2016).
International Search Report from PCT/EP2018/076035 dated Dec. 19, 2018.

* cited by examiner

DIXON TYPE WATER/FAT SEPARATION MR IMAGING WITH IMPROVED FAT SHIFT CORRECTION

CROSS REFERENCE TO RELATED APPLICATIONS

This application is a U.S. national phase application of International Application No. PCT/EP2018/076035 filed on Sep. 26, 2018, which claims the benefit of EP Application Serial No. 17193731.1 filed on Sep. 28, 2017 and is incorporated herein by reference.

FIELD OF THE INVENTION

The invention relates to the field of magnetic resonance (MR) imaging. It concerns a method of MR imaging of an object placed in a main magnetic field within an examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z-axis to the transverse plane (flip angle 90°).

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each k-space line is digitized by collecting a number of samples. A set of k-space data is converted to an MR image, e.g., by means of Fourier transformation.

In MR imaging, it is often desired to obtain information about the relative contribution of water and fat to the overall signal, either to suppress the contribution of one of them or to separately or jointly analyze the contribution of both of them. These contributions can be calculated if information from two or more corresponding echoes, acquired at different echo times, is combined. This may be considered as chemical shift encoding, in which an additional dimension, the chemical shift dimension, is defined and encoded by acquiring two or more MR images at slightly different echo times. For water/fat separation, these types of experiments are often referred to as Dixon-type of measurements. By means of Dixon MR imaging or Dixon water/fat MR imaging, a water/fat separation is achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of the 'in-phase' and 'out-of-phase' datasets.

Several Dixon-type MR imaging methods have been proposed in recent years. Apart from different strategies for the water/fat separation, the known techniques are mainly characterized by the specific number of echoes (or 'points') they acquire and by the constraints that they impose on the used echo times. Conventional so-called two- and three-point methods require in-phase and opposed-phase echo times at which the water and fat signals are parallel and antiparallel in the complex plane, respectively. Three-point methods have gradually been generalized to allow flexible echo times. Thus, they do not restrict the angle or phase between the water and fat signals at the echo times to certain values anymore. In this way, they provide more freedom in imaging sequence design and enable in particular a trade-off between signal-to-noise ratio (SNR) gains from the acquisition and SNR losses in the separation. On the other hand, sampling only two instead of three echoes is desirable to reduce scan time. Eggers et al. (Magn. Reson. Med., 65:96-107, 2011) have proposed a dual-echo flexible Dixon-type MR imaging method. Using such Dixon-type MR imaging methods with flexible echo times, in-phase and opposed-phase images are no longer necessarily acquired, but optionally synthesized from water and fat images.

Various strategies can be used in Dixon imaging for acquiring echo signals at two different echo times, including: (i) dual-pass strategies, wherein each echo signal is acquired separately after an excitation RF pulse using a positive amplitude readout magnetic field gradient, (ii) fly-back strategies, wherein both echo signals are acquired after the same excitation RF pulse using a positive amplitude readout magnetic field gradient in combination with a negative amplitude re-winder magnetic field gradient, and (iii) bipolar strategies, wherein both echo signals are acquired after the same excitation RF pulse, one echo being acquired using a positive amplitude readout magnetic field gradient and the other echo being acquired using a negative amplitude readout magnetic field gradient. Bipolar strategies offer many attractive advantages, such as shorter scan times, higher SNR (signal-to-noise ratio) efficiency, a more robust field map estimation, reduced motion-induced artifacts, and less sensitivity to short $T_2^*$. However, the alternating readout magnetic field gradients cause several problems, including phase errors and geometric distortions, which limit the direct application of existing Dixon water/fat separation techniques. The reversal of the polarity of the readout magnetic field gradient leads to geometric distortions in opposite directions between odd and even echoes.

Lu et al. (Magn. Reson. Med. 2008, 60:198-209) propose a three-step procedure to address these problems. First, a post-processing is applied to the acquired echo signals prior to water/fat separation. This post-processing includes shifting the k-space data to correct for phase errors due to echo misalignment. Second, the image data are resampled with the aid of a field map to correct for main field inhomogeneity-induced geometric distortions. The field map is estimated from low-resolution image data, where the geometric distortions are negligible, to avoid introducing field map estimation errors. Third, water/fat separation is performed in k-space, whereby chemical shift-induced geometric distortions are eliminated.

This known approach principally succeeds in correcting/suppressing artifacts related to main field inhomogeneity and chemical shift. However, water images reconstructed with this approach exhibit an incomplete fat suppression in particular at inter-faces between different tissues or between tissue and air.

In the US-patent application US2017/0038446 a phase correction is addressed that is linked to the water-fat frequency shift. However, this correction addresses a phase error due to the additional phase accumulation between the different echoes and between water and fat due the water-fat frequency shift.

SUMMARY OF THE INVENTION

It is an object of the invention to provide a Dixon-type MR imaging technique using bipolar readout magnetic field gradients with an improved estimation of the main field inhomogeneity to eliminate residual artifacts.

In accordance with the invention, a method of MR imaging of an object placed in a main magnetic field within an examination volume of a MR device is proposed, wherein the method comprises the steps of:

subjecting the object to an imaging sequence to generate at least two sets of echo signals at two or more different echo times using bipolar pairs of readout magnetic field gradients, one set of echo signals being generated at a first echo time and the other set of echo signals being generated at a second echo time, acquiring the echo signals from the object, reconstructing a first image from the echo signals attributed to the first echo time and a second image from the echo signals attributed to the second echo time, computing modified first and second images by compensating for a fat shift in the reconstructed first and second images respectively, estimating phase errors in the acquired echo signals on the basis of the first and second images and the modified first and second images using a signal model including the resonance spectra of fat and water and the spatial variation of the main magnetic field, and reconstructing a water image and/or a fat image by separating the signal contributions of fat and water to the acquired echo signals using the estimated phase errors.

Two echo signals are acquired using a pair of temporally adjoining readout magnetic field gradients with opposed polarity. The first echo is acquired at a first echo time using a positive amplitude readout magnetic field gradient and the second echo is acquired at a second echo time using a negative amplitude readout magnetic field gradient (or vice versa).

More than two echo signals may be acquired and processed correspondingly. For the sake of simplicity, however, only the case of two echo signals is explicitly discussed henceforth.

The amplitudes of the readout magnetic field gradients may differ in magnitude, in which case the two or more echo signals may be acquired with variable bandwidth.

The invention principally adopts the method steps of a conventional multi-echo Dixon technique using bipolar readout magnetic field gradients. As an addition, the invention proposes, in order to better take the chemical shift-induced geometric distortion into account, to base the estimation of the phase errors, i.e. the field map, not only on the two original single-echo images (the first and second images within the meaning of the invention), but also on two modified single-echo images (the modified first and second images within the meaning of the invention), in which the fat shift is compensated. Compensation of the fat shift means that the contents of the first and second images are spatially shifted in the positive and negative readout direction, depending on the respective polarity of the readout magnetic field gradient. In the simplest form, the 1H MR spectrum of fat is reduced to a single peak at about 3.3 ppm relative to the resonance frequency of water for this purpose. The resonance frequency of fat is then about 210 Hz (at 1.5 T) or 420 Hz (at 3 T) lower than the resonance frequency of water. This difference in chemical shift or resonance frequency leads to a spatial displacement of the signal contributions from fat in the reconstructed first and second images. This spatial displacement is corrected for in the modified first and second images according to the invention by a corresponding opposite spatial displacement. The fat signal contributions will thus be correctly registered in the modified first and second images, while the signal contributions from water will be misregistered. If a multi-peak spectral model of fat is used instead, the fat signal contributions can still be correctly registered in the modified first and second images. The spatial displacement just has to be replaced by an appropriate spatial convolution or filtering.

The present invention achieves to correct for phase-errors associated with the gradient field induced spatial encoding of the reconstructed magnetic resonance images. An insight of the present invention is that the chemical shift affects the spatial encoding of water and fat voxels differently. This correction will improve the accuracy of the water-fat separation for any n-point Dixon technique for n>1. That is, the correction applies to any pair or reconstructed water and fat images, no matter the details of the multi-echo acquisition technique. Also the benefit of the phase correction for the difference in gradient encoding is achieved whether or not the ultimate water fat separation makes use of an estimate of water and fat dominant voxels, respectively.

In a preferred embodiment, the phase errors are estimated in two individual computation steps using the first and second images in one computation step and using the modified first and second images in another computation step, wherein, for each voxel position, the phase error estimated on the basis of the first and second images is selected if the contribution from water is found to dominate at the respective voxel position and the phase error estimated on the basis of the modified first and second images is selected if the contribution from fat is found to dominate at the respective voxel position. In this way, the estimation of the phase error is predominantly based on the correctly registered signal contributions at each voxel position, thereby effectively compensating for the chemical shift-induced geometric distortion which is due to the bipolar acquisition strategy.

In a further preferred embodiment of the invention, the step of estimating the phase errors includes:
calculating potential solutions for the phase error at each voxel position, and
selecting one solution for the phase error by maximizing the spatial smoothness of the variation of the phase error over neighboring voxel positions.

This is similarly performed in conventional two-point Dixon methods (see Eggers et al., J. Magn. Reson. Imaging 2014; 40:251-268). A signal model is used which includes the signal contributions from water and fat at each voxel position, the phase offset between water and fat induced by the difference in chemical shift (resulting from the chosen spectral model of fat and the two echo time values used in the signal acquisition) and the (predominantly main field inhomogeneity-induced) phase error. The fundamental ambiguity in the derivation of the three unknowns of the signal model (water contribution, fat contribution, phase error) from the two single-echo images is commonly resolved by the assumption of spatial smoothness of the main field inhomogeneity. Hence, instead of a direct calculation of the water and fat signal contributions, two-point Dixon methods typically perform the separation in three steps: First, potential solutions for the phase error are calculated. This is independently done for each voxel such that this step is affected by any misregistration between the two single-echo images. Then, one solution is selected for each voxel by maximizing the spatial smoothness of the phase error and, finally, the water and fat signal contributions are estimated given the phase error.

The invention proposes to perform the first step twice, once on the first and second images and once on the modified first and second images, in which the fat shift is compensated. In this way, the water signal is registered and the fat signal is misregistered in the two original single-echo images (the first and second images), whereas the water signal is misregistered and the fat signal is registered in the two modified single-echo images (the modified first and second images). The respectively found solutions for the phase errors are then used to estimate potential values for the water and fat signal contributions. If this estimation indicates a dominance of water in a voxel, the corresponding potential value for the phase error derived from the two original single-echo images is used. If the potential values for the water and fat signal indicate a dominance of fat signal in a voxel, the corresponding potential value for the phase error derived from the two modified single-echo images is used instead. In this way, the misregistration between the two single-echo images which is due to the bipolar acquisition is suitably addressed and corresponding image artifacts are reduced.

Because of eddy current effects occurring with bipolar acquisitions, the two echo signals are preferably corrected for k-space misalignment prior to reconstructing the first and second images. With regard to the details of this correction step reference is made to the article by Lu et al. cited above.

In a further preferred embodiment, a compensation for a main field inhomogeneity-induced shift in both the reconstruction of the first and second images and in the computation of the modified first and second images is introduced. The information about the main field inhomogeneity may be obtained from i) prior knowledge (e.g. a separate scan of the $B_0$ map), ii) low-resolution images (e.g. as proposed in the above-cited article by Lu et al.), or iii) the estimated phase errors. In the latter case, an iterative approach is applied. In a first step, the $B_0$ map is derived from the phase errors estimated according to the invention, then the corresponding shifts in the first and second images as well as the modified first and second images are compensated for, and the estimation of the phase errors is repeated on the basis of the compensated images. This iteration may be repeated until convergence is reached.

The method of the invention described thus far can be carried out by means of a MR device including at least one main magnet coil for generating an essentially uniform, static main magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention.

In the drawings.

DETAILED DESCRIPTION OF THE EMBODIMENTS

Figure 1:
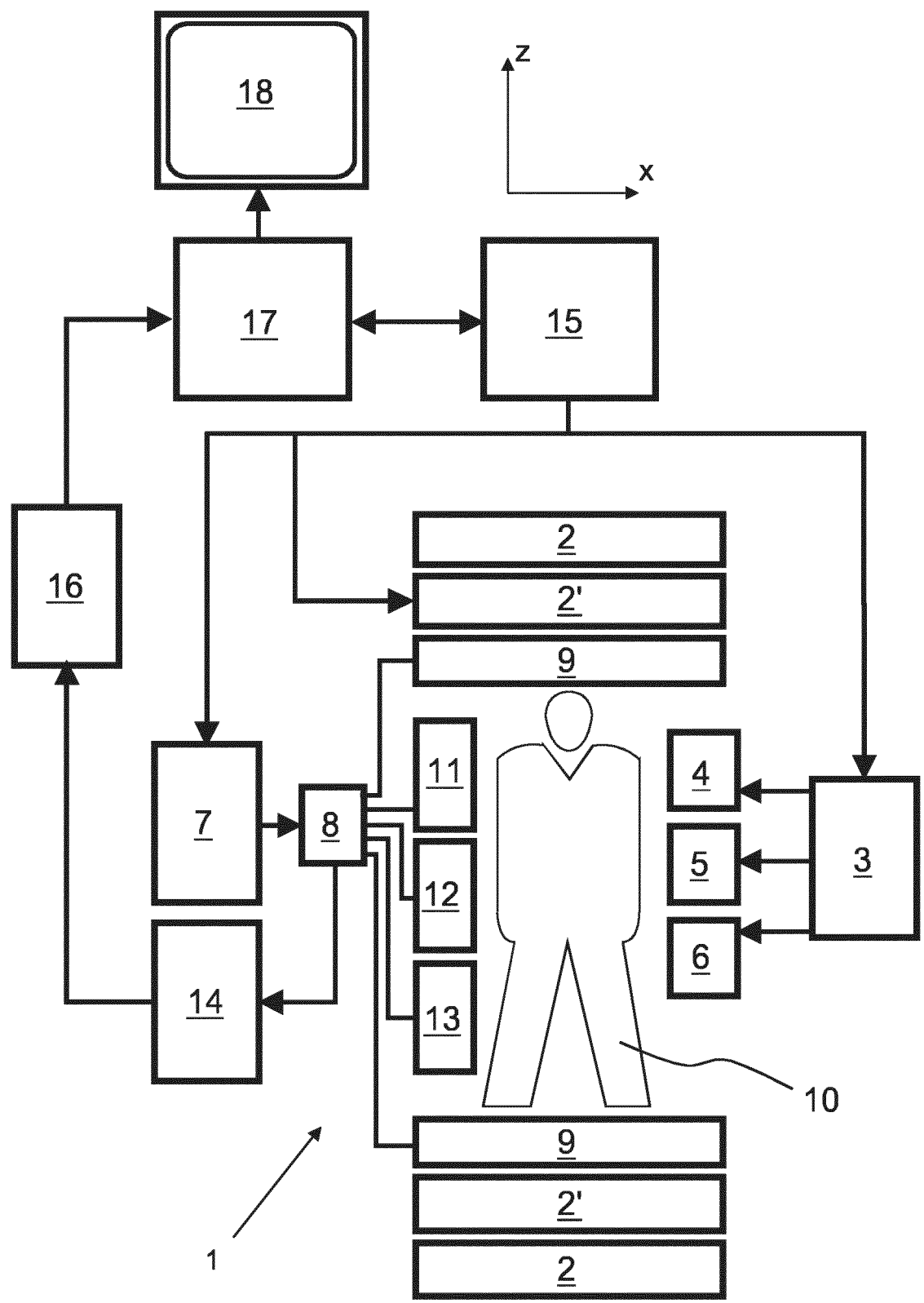
FIG. 1 shows a MR device for carrying out the method of the invention.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8 and a body RF coil 9, into the examination volume. A typical MR imaging sequence is composed of a packet of RF pulse segments of short duration which, together with any applied magnetic field gradients, achieve a selected manipulation of nuclear magnetic resonance. The RF pulses are used to saturate resonance, excite resonance, invert magnetization, refocus resonance, or manipulate resonance and select a portion of a body 10 positioned in the examination volume. The MR signals are also picked up by the body RF coil 9.

For generation of MR images of limited regions of the body 10, a set of local array RF coils 11, 12, 13 are placed contiguous to the region selected for imaging. The array coils 11, 12, 13 can be used to receive MR signals induced by RF transmissions via the body RF coil.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via the send/receive switch 8.

A host computer 15 controls the shimming coils 2' as well as the gradient pulse amplifier 3 and the transmitter 7 to generate the imaging sequences of the invention. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 and the reconstruction processor 17 are programmed to execute the method of the invention as described above and in the following.

Figure 2:
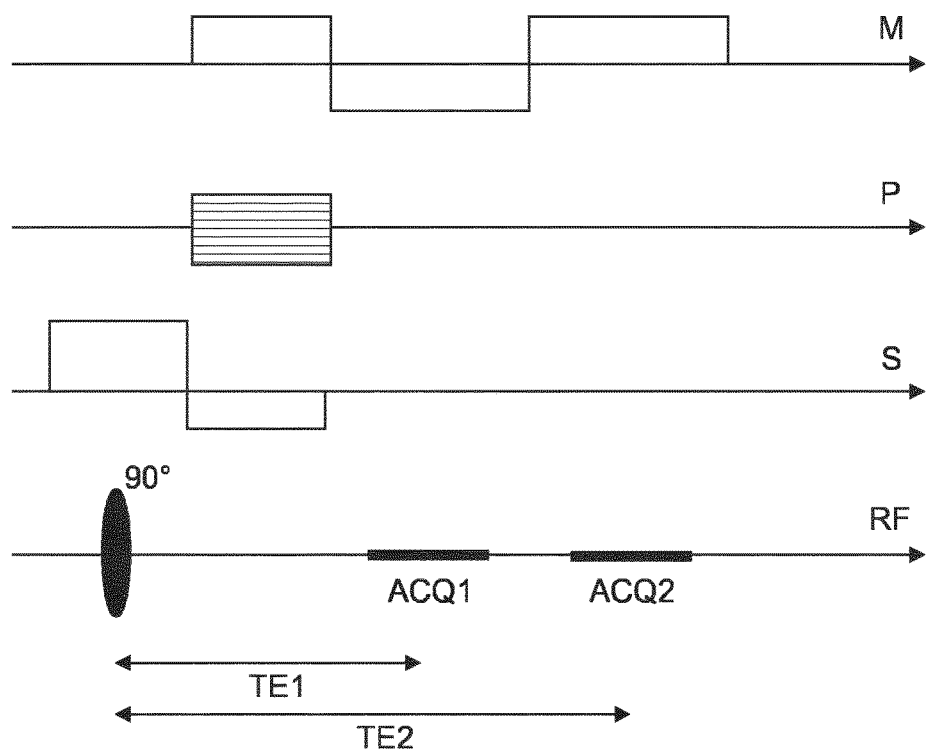
FIG. 2 shows a schematic (simplified) pulse sequence diagram of a Dixon imaging sequence using bipolar readout magnetic field gradients according to the invention.

In FIG. 2, a schematic pulse sequence diagram of a dual-echo Dixon imaging sequence using bipolar readout magnetic field gradients according to the invention is depicted. The diagram shows switched magnetic field gradients in the frequency-encoding direction (M), the phase-encoding direction (P) and the slice-selection direction (S). Moreover, the diagram shows an RF excitation pulse as well as the time intervals during which echo signals are acquired, designated by ACQ1 and ACQ2. The diagram covers the acquisition of one pair of echo signals. A number of such pairs of echo signals is acquired by multiple repetitions of the depicted sequence using different phase encodings (P) to completely cover the required region of k-space. Each pair of echo signals is acquired using a corresponding pair of readout magnetic field gradients (M) with opposed polarity. The timing and amplitudes of the bipolar readout magnetic field gradients are chosen to shift the acquisition windows ACQ1 and ACQ2 of the echo signals such that different echo times TE1 and TE2 and correspondingly different phase offsets of the signal contributions from water protons and fat protons are provided. One set of echo signals is acquired at echo time TE1 and another set of echo signals is acquired at echo time TE2. The Dixon-type separation of these signal contributions is based on the resulting phase offsets in the final step of reconstruction of a water and/or a fat image.

For separating water and fat, i.e. for finally reconstructing a pure water and/or a pure fat image from the acquired sets of echo signals, initially a first image is reconstructed from the echo signals attributed to the first echo time TE1 and a second image is reconstructed from the echo signals attributed to the second echo time TE2. A signal model is used for water/fat separation which includes the signal contributions from water and fat at each voxel position, a phase offset between water and fat induced by the difference in chemical shift and a (main field inhomogeneity-induced) phase error. Potential solutions for the phase error, as well as corresponding potential solutions for the water and the fat signal, are computed. Then, these steps are repeated, this time with a compensation of the fat shift, yielding modified first and second images and corresponding potential solutions for the phase error and the water and the fat signal. If a particular potential solution for the water and fat signal in a particular voxel indicates a dominance of water in this voxel, the corresponding potential solution for the phase error derived from the original first and second image is taken. If a particular potential solution for the water and fat signal in a particular voxel indicates a dominance of fat in this voxel, the corresponding potential solution for the phase error derived from the modified first and second image is taken instead. Finally, the ambiguity in the estimation of the phase error is resolved by the assumption of spatial smoothness of the main field inhomogeneity. One of the potential solutions is selected for each voxel by maximizing the spatial smoothness of the phase error. A water image and/or a fat image is then obtained using the phase errors determined in this fashion for each voxel.

Figure 3:
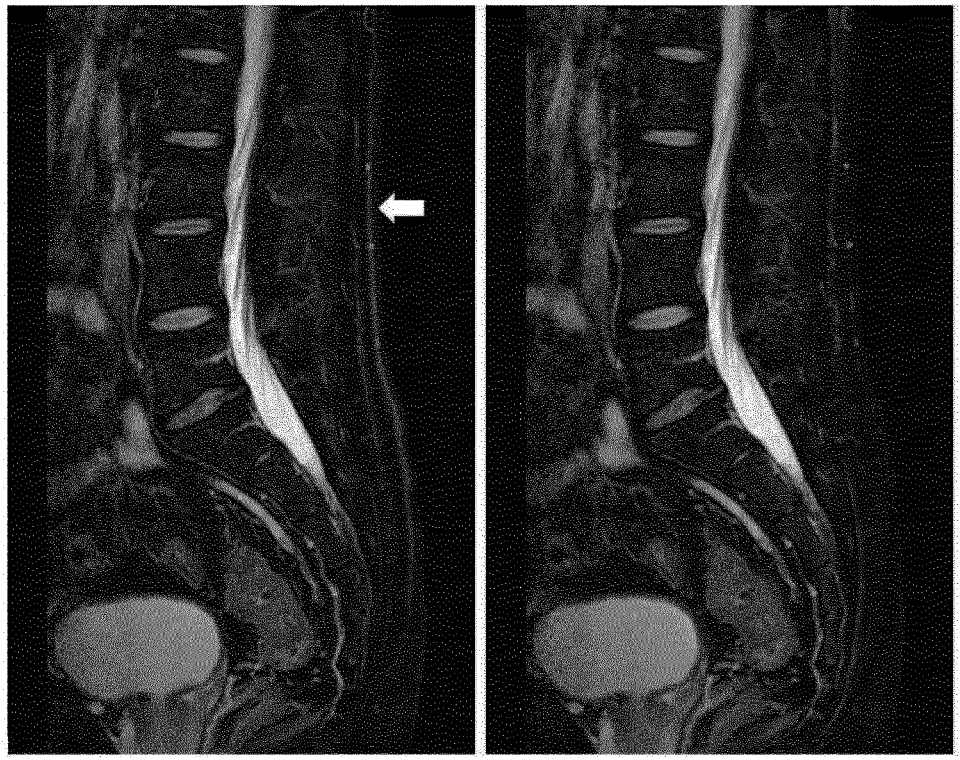
FIG. 3 shows a comparison of water images obtained with a conventional water/fat separation (left) and with the method of the invention (right).

By the afore described method of the invention, a misregistration between the two single-echo images which is due to the bipolar acquisition is suitably addressed and corresponding image artifacts are significantly reduced. This is evident from FIG. 3, which shows a comparison of water images obtained with a conventional two-point water/fat separation (left) and the water/fat separation technique of the invention (right). The white arrow points at an incomplete fat suppression at a tissue/air interface using the conventional technique. This artifact is not present in the right image which is obtained by the method of the invention.

The invention claimed is:

1. A method of magnetic resonance (MR) imaging of an object placed in a main magnetic field within an examination volume of a MR device, the method comprising:
   subjecting the object to an imaging sequence to generate at least two sets of echo signals at two or more different echo times using bipolar pairs of readout magnetic field gradients, one set of echo signals being generated at a first echo time (TE1) and another set of echo signals being generated at a second echo time (TE2),
   acquiring the at least two sets of echo signals from the object,
   reconstructing a first MR image from the echo signals attributed to the first echo time (TE1) and a second MR image from the echo signals attributed to the second echo time (TE2),
   computing modified first and second images by compensating for a fat shift in the reconstructed first and second MR images respectively to correct for phase-errors associated with a gradient field induced spatial encoding of the reconstructed MR images,
   estimating phase errors in the acquired echo signals on the basis of the first and second images and the modified first and second images using a signal model including a resonance spectra of fat and water and a spatial variation of the main magnetic field, and
   reconstructing a water image and/or a fat image by separating signal contributions of fat and water to the acquired at least two sets of echo signals using the estimated phase errors.

2. The method of claim 1, wherein the phase errors are estimated in two individual computation steps using the first and second images in one computation step and using the modified first and second images in another computation step, wherein, for each voxel position, the phase error estimated on the basis of the first and second images is selected if a contribution from water is found to dominate at the respective voxel position and the phase error estimated on the basis of the modified first and second images is selected if a contribution from fat is found to dominate at the respective voxel position.

3. The method of claim 1, wherein the signal model includes a multi-peak spectral model of fat.

4. The method of claim 1, wherein the step of estimating the phase errors includes:
   calculating potential solutions for the phase error at each voxel position, and
   selecting one solution for the phase error by maximizing a spatial smoothness of a variation of the phase error over neighboring voxel positions.

5. The method of claim 1, wherein the two echo signals are corrected for k-space misalignments prior to reconstructing the water and fat images.

6. The method of claim 1, wherein a main magnetic field inhomogeneity induced shift is compensated for in the first and second images as well as in the modified first and second images.

7. A magnetic resonance (MR) device comprising at least one main magnet coil for generating a uniform, static main magnetic field B0 within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling a temporal succession of RF pulses and switched magnetic field gradients, and a reconstruction unit for reconstructing MR images from the received MR signals, wherein the MR device is configured to perform the steps of the method of claim 1.

8. A computer program to be run on a MR device, which computer program comprises executable instructions stored on a non-transitory computer readable medium for executing the method of claim 1.

* * * * *